United States Patent
Munnelly

(10) Patent No.: US 7,622,241 B2
(45) Date of Patent: Nov. 24, 2009

(54) INITIATOR COMPOSITIONS, NEGATIVE-WORKING IMAGEABLE ELEMENTS, AND METHODS OF USE

(75) Inventor: Heidi M. Munnelly, Windsor, CO (US)

(73) Assignee: Eastman Kodak Company, Rochester, NY (US)

( * ) Notice: Subject to any disclaimer, the term of this patent is extended or adjusted under 35 U.S.C. 154(b) by 107 days.

(21) Appl. No.: 11/768,226

(22) Filed: Jun. 26, 2007

(65) Prior Publication Data

US 2009/0004595 A1 Jan. 1, 2009

(51) Int. Cl.
*G03F 7/00* (2006.01)
*G03F 7/004* (2006.01)

(52) U.S. Cl. .............................. 430/270.1; 430/270.15; 430/302; 430/913; 430/944; 430/945

(58) Field of Classification Search ................ 430/945, 430/944, 302, 270.1, 913, 270.15
See application file for complete search history.

(56) References Cited

U.S. PATENT DOCUMENTS

| | | | |
|---|---|---|---|
| 6,010,824 A | 1/2000 | Komano et al. | |
| 6,818,372 B2 | 11/2004 | Kunita et al. | |
| 6,877,428 B2* | 4/2005 | Tabuchi et al. | 101/467 |
| 6,881,532 B2* | 4/2005 | Suzuki | 430/302 |
| 6,936,384 B2 | 8/2005 | Munnelly et al. | |
| 7,108,952 B2 | 9/2006 | Sugasaki et al. | |
| 7,122,293 B2 | 10/2006 | Sugasaki et al. | |
| 7,261,998 B2* | 8/2007 | Hayashi et al. | 430/271.1 |
| 2001/0007736 A1* | 7/2001 | Takasaki et al. | 430/281.1 |
| 2005/0271981 A1* | 12/2005 | Oohashi et al. | 430/300 |
| 2006/0005725 A1* | 1/2006 | Aoshima et al. | 101/453 |
| 2006/0046189 A1 | 3/2006 | Kunita et al. | |
| 2006/0269874 A1* | 11/2006 | Huang et al. | 430/302 |

OTHER PUBLICATIONS

U.S. Appl. No. 11/441,601, filed May 26, 2006, titled Negative-Working Radiation-Sensitive Compositions and Imageable Materials, by Ting Tao et al.
U.S. Appl. No. 11/475,694, filed Jun. 27, 2006, titled Negative-Working Radiation-Sensitive Compositions and Imageable Elements, by H. Munnelly et al.
U.S. Appl. No. 11/682,906, filed Mar. 7, 2007, titled Negative-Working Imageable Elements and Methods of Use, by H. Munnelly et al.

* cited by examiner

*Primary Examiner*—Amanda C. Walke
(74) *Attorney, Agent, or Firm*—J. Lanny Tucker

(57) ABSTRACT

An initiator composition and infrared radiation-sensitive composition include an onium cation and a boron-containing anion as well as a metallocene. These compositions can be used to provide negative-working imageable elements that can be imaged and developed to provide lithographic printing plates that have desired imaging speed, excellent run length, and shelf life without the need for a post-exposure baking step and oxygen barrier overcoat.

23 Claims, No Drawings

иНITIATOR COMPOSITIONS, NEGATIVE-WORKING IMAGEABLE ELEMENTS, AND METHODS OF USE

FIELD OF THE INVENTION

This invention relates to free radical initiator compositions and their use in negative-working radiation-sensitive compositions and imageable elements such as negative-working lithographic printing plate precursors. These imageable elements also can be developed off-press. The invention also relates to methods of using these imageable elements to make lithographic printing plates.

BACKGROUND OF THE INVENTION

Radiation-sensitive compositions are routinely used in the preparation of imageable materials including lithographic printing plate precursors. Such compositions generally include a radically polymerizable component, radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various radiation compositions and imageable elements are described in U.S. Pat. No. 6,569,603 (Furukawa) and EP 1,182,033A1 (Fujimaki et al.). Other IR-sensitive compositions are described in U.S. Pat. No. 6,309,792 (Hauck et al.), U.S. Pat. No. 6,893,797 (Munnelly et al.), U.S. Pat. No. 6,787,281 (Tao et al.), and U.S. Pat. No. 6,899,994 (Huang et al.), U.S. Patent Application Publication 2003/0118939 (West et al.), and EP 1,079,276A1 (Lifka et al.) and EP 1,449,650A1 (Goto). Still other imaging compositions and elements are described in U.S. Pat. No. 6,858,373 (Kunita) and U.S. Patent Application Publication 2004/0043325 (Shibuya et al.).

Negative-working imaging compositions and element can have components that generate free radicals and other components that react, polymerize, or crosslink in the presence of those free radicals. Initiator compositions that will produce free radicals in response to irradiation (such as UV, visible, or infrared irradiation) are known in the art. For example, U.S. Pat. No. 6,936,384 (Munnelly et al.) describes the use of compounds that produce free radicals response to infrared radiation, such as borates, alkyltriarylborates, triazines, and onium salts including iodonium salts. This reference also describes the presence of metallocenes to maintain imaging speed after accelerated aging tests. The imageable elements described in this reference also included a poly(vinyl alcohol) oxygen barrier layer over the imageable layer. It is also known that alkyltriarylborates can provide free radicals for radiation-sensitive imageable compositions but that such compositions have poor shelf-life.

The use of titanocenes are also described for UV and visible radiation-sensitive imaging compositions in, for example, U.S. Pat. No. 6,010,824 (Komano et al.), U.S. Pat. No. 6,818,372 (Kunita et al.), U.S. Pat. No. 7,1,108,952 (Sugasaki et al.), and U.S. Pat. No. 7,122,293 (Sugashi et al.), and U.S. Patent Application Publication 2006/0046189 (Kunita et al.).

Problem to be Solved

The various radiation sensitive compositions of the art can readily be used to prepare negative-working imageable elements but they generally require the use of a post-exposure baking step ("pre-heat" step) to enhance good adhesion and run length. Omitting the post-exposure baking step can result in complete image failure following development with alkaline developers. During long print runs, they may also show a loss of highlight dots long before solid image areas show signs of wear or degradation.

In addition, many of the negative-working imageable elements also include an overcoat to provide an oxygen barrier to inhibit premature reaction within the imageable layer and thus to slow down image speed loss. However, adding this layer complicates manufacture and adds cost to the imageable elements. The overcoat can also reduce the effectiveness of some alkaline developers.

It would be desirable in the industry to have highly sensitive negative-working imageable compositions and elements that provide good run length, shelf life, and imaging speed but that can also be prepared for use without a post-exposure baking step and an overcoat.

SUMMARY OF THE INVENTION

The present invention provides an infrared radiation-sensitive, free radical initiator composition consisting essentially of:
a) an infrared radiation absorbing chromophore,
b) an onium cation,
c) a boron-containing anion,
d) a metallocene, and
e) optionally, an antioxidant,
provided that when the onium cation and the boron-containing anion are provided as part of the same salt, the boron-containing anion is an alkyltriarylborate anion.

In addition, this invention provides an infrared radiation-sensitive composition comprising:
a) an infrared radiation absorbing chromophore,
b) an onium cation,
c) a boron-containing anion,
d) a metallocene,
e) optionally, an antioxidant,
f) a radically polymerizable component, and
g) an alkaline developer-soluble polymeric binder,
provided that when the onium cation and the boron-containing anion are provided as part of the same salt, the boron-containing anion is an alkyltriarylborate anion.

Further, a negative-working, infrared radiation-sensitive imageable element of this invention comprises a substrate having thereon a single imageable layer as the outermost layer, the imageable layer comprising:

a) an infrared radiation absorbing chromophore,
b) an onium cation,
c) a boron-containing anion,
d) a metallocene,
e) optionally, an antioxidant,
f) a radically polymerizable component, and
g) an alkaline developer-soluble polymeric binder, provided that when the onium cation and the boron-containing anion are provided as part of the same salt, the boron-containing anion is an alkyltriarylborate anion.

This invention further provides a method of making an imaged element comprising:

A) imagewise exposing the imageable element of this invention using imaging infrared radiation to produce exposed and non-exposed regions, and B) without a post-exposure baking step, developing the imagewise exposed element off-press to remove only the non-exposed regions.

The initiator compositions, infrared radiation-sensitive compositions and imageable elements of this invention provide imaged elements (for example, lithographic printing plates) with improved run length without the need for a post-exposure baking step. In addition, I found that the infrared radiation-sensitive compositions and imageable elements of this invention retain desirable imaging sensitivity (speed), for example when using an imaging exposure energy of about 80 mJ/cm$^2$, which is a considerable advantage over known negative-working imageable elements. I also found that shelf life is not unacceptably affected if the overcoat is omitted, even when alkyltriarylborates are used as part of the initiator composition.

These advantages are achieved with a unique combination of components in an initiator composition that is then included in the infrared radiation-sensitive composition and imageable element. The initiator composition includes both an onium cation (such as an iodonium cation described below) and a boron-containing anion, for example an alkyltriarylborate anion. The onium cation and boron-containing anion can be provided as part of the same salt, or as separate salts, as described in more detail below. This combination of components enables the omission of the pre-exposure baking step between imaging and development of the imageable element, and the omission of an overcoat. The addition of a metallocene to the initiator composition improves shelf life. In some instances, if the use of the combination of metallocenes and boron-containing anions increases sensitivity to fogging, an appropriate antioxidant can also be included in the imageable element.

DETAILED DESCRIPTION OF THE INVENTION

Definitions

Unless the context indicates otherwise, when used herein, the terms "initiator composition", "infrared radiation-sensitive composition", "imageable element", "lithographic printing plate precursor", and "printing plate precursor" are meant to be references to embodiments of the present invention.

In addition, unless the context indicates otherwise, the various components described herein such as "onium cation", "boron-containing anion", "metallocene", "free radically polymerizable component", "infrared radiation absorbing compound", "alkaline developer-soluble polymeric binder", "phosphate (meth)acrylate", and similar terms also refer to mixtures of such components. Thus, the use of the articles "a", "an", and "the" is not necessarily meant to refer to only a single component.

The term "single-layer imageable element" refers to an imageable element having only one imageable layer that is essential to imaging, but as pointed out in more detail below, such elements may also include one or more layers under the imageable layer to provide various properties. However, the single imageable layer is the outermost layer in the imageable element (no overcoat or topcoat is present).

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Initiator Compositions

The radiation-sensitive composition includes an initiator composition that is capable of generating free radicals sufficient to initiate polymerization or crosslinking of all the various free radically polymerizable components upon exposure of the composition to imaging radiation. The initiator composition is generally responsive to electromagnetic imaging radiation in the infrared or near infrared spectral regions, corresponding to the spectral range of at least 700 nm and up to and including 1500 nm. More typically, they are responsive to infrared radiation of at least 700 nm and up to and including 1200 nm, or from about 750 nm to about 1150 nm. Initiator compositions are used that are appropriate for the desired imaging wavelength(s).

In general, suitable initiator compositions include only specific free radical generating species that work together to provide the advantages of the present invention. These specific free radical generating species include first and second free radical generating species (defined below) that are different. There may be multiple species of each type. In addition, the initiator composition has a metallocene that is also defined below.

The first free radical generating species is an onium salt. These species are well defined in the literature relating to radiation-sensitive components. The onium salts include but not limited to, sulfonium, oxysulfoxonium, oxysulfonium, sulfoxonium, ammonium, N-alkoxypyridinium, selenonium, arsonium, phosphonium, diazonium, and halonium salts. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N≡N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents such as iodonium salts. The onium salts generally include a suitable number of negatively-charged counterions such as halides, hexafluorophosphate, thiosulfate, hexafluoroantimonate, tetrafluoroborate, sulfonates, hydroxide, perchlorate, n-alkyltriarylborates (such as butyltriphenyl borate), tetraaryl borates (such as tetraphenylborates), and others readily apparent to one skilled in the art.

The iodonium cations are particularly useful. In one embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Still other useful onium cations are diaryliodonium cations that can be represented by the following Structure (IB):

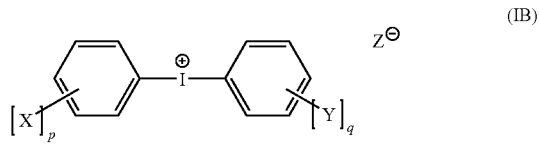

(IB)

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). For example, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated by this invention but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents can be at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5, provided that either p or q is at least 1. Typically, both p and q are at least 1, or each of p and q is 1. Thus, it is understood that the carbon atoms in the phenyl rings that are not substituted by X or Y groups have a hydrogen atom at those ring positions.

In Structure IB, $Z^-$ is any suitable organic anion such as a halide, hexafluorophosphate, thiosulfate, hexafluoroantimonate, tetrafluoroborate, sulfonate, hydroxide, perchlorate, or a boron-containing anion represented by the following Structure (IB$_Z$):

(IB$_Z$)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups).

Representative iodonium borate compounds include but are not limited to, 4-methylphenyl-4'-cyclohexylphenyliodonium n-butyltriphenylborate.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999), both of which are incorporated herein by reference.

The second free radical generating species is a boron containing anion that can be supplied as part of an onium salt (such as an iodonium salt). When supplied as part of such salts, the boron-containing anion is an alkyltriarylborate anion wherein the alkyl and aryl groups attached to the boron atom are as defined above for Structure IBz.

In other embodiments, the boron-containing anion is supplied from a source other than as part of an onium salt. Such boron-containing anions have four of the same or different organic groups attached to the boron atom (such as tetraarylborates and alkyltriarylborates) and organoborate salts such as those described in U.S. Pat. No. 6,562,543 (Ogata et al.). Examples of useful compounds containing a boron-containing anion include tetra-n-butylammonium n-butyltriphenylborate, tetra-n-butylammonium n-butyltri(1-naphthyl)borate, and tetra-n-butylammonium tri(p-t-butylphenyl)-n-butylborate.

The boron-containing anion can also be supplied as part of a cationic infrared radiation sensitizing dye (IR absorbing chromophore). Such IR dyes are described for example in U.S. Pat. No. 6,569,603 (Furukawa) and Japanese Kokai 2001-222101 (Furukawa et al.). For example, such boron-containing anions can be associated as the counterion for cationic IR dyes containing a tetraaryl pentadiene chromophore (defined in more detail below).

Metallocenes are organometallic compounds having one or more cyclopentadienyl ligands that are optionally substituted at one or all of the ring carbons. Each carbon in the five-member ligand ring is coordinated to the transition metal center. Metallocenes are known for having a wide variety of transition metals including iron, titanium, tungsten, molybdenum, nickel, cobalt, chromium, zirconium, and manganese.

For example, ferrocenes have an iron center coordinated by at least one cyclopentadienyl ligand, but ferrocenes also include bicyclopentadienyl "sandwich" compounds. Suitable ferrocene compounds include those that have a hexhapto benzene ligand coordinated to the iron center. Examples of such compounds are described in Col. 7 of U.S. Pat. No. 6,936,384 (Munnelly et al.) that is incorporated herein by reference. Other suitable ferrocenes include compounds having halogenated, aryl-substituted, or haloaryl-substituted cyclopentadienyl ligands.

Titanocenes are also useful in the practice of this invention. Such compounds have a titanium center coordinated by at least one pentahapto cyclopentadienyl ligand and generally include additional ligands that may be known for organometallic complexes. Some suitable titanocene compounds include in their structures aryl ligands, haloaryl ligands, or pyrrole-substituted aryl ligands. Examples of useful titanocenes include those described in Col. 8 of U.S. Pat. No. 6,936,384 (noted above). One commercially available titanocene is (bis)cyclopentadienyl-(bis)2,6-difluoro-3-(pyrr-1-yl)phen-1-yl titanium sold by Ciba Specialty Chemicals as Irgacure® 784, as noted below with the Examples. Other suitable titanocenes are described in U.S. Pat. No. 4,548,891 (Riediker et al.), U.S. Pat. No. 4,590,287 (Riediker et al.), U.S. Pat. No. 5,008,302 (Husler et al.), U.S. Pat. No. 5,106,722 (Husler et al.), U.S. Pat. No. 6,010,824 (Komano et al.), and U.S. Pat. No. 6,153,660 (Fujimaki et al.).

Thus, combinations of components can be used in various embodiments of the initiator composition, including but not limited to:

a) an onium cation (such as an iodonium cation in a non-boron containing onium salt) used in combination with a metallocene and a boron-containing anion that comprises four of the same or different alkyl or aryl groups, or any combination thereof, and that is supplied as a counterion for a cationic infrared radiation absorbing dye, b) an onium cation (such as an iodonium cation as part of an iodonium salt containing a boron-containing anion) used in combination with a metallocene, for example as the combination of a boron-containing anion that is an alkyltriarylborate anion and is provided with the onium cation that is a diaryliodonium cation, along with a titanocene.

c) an onium cation (such as an iodonium cation in a non-boron containing onium salt) used in combination with a metallocene and a boron-containing anion that is supplied as a separate salt that is not an infrared radiation absorbing dye.

Thus, in some embodiments, the onium cation, boron-containing anion, and the infrared radiation absorbing chromophore (described below) can be provided from distinct sources or an individual compounds (that is, two or all three of them are not provided as part of the same compound).

The initiator composition includes the onium cation in an amount of at least 0.5 and up to 15 weight %, and typically from about 2 to about 8 weight %, based on the total dry infrared radiation sensitive composition weight. In addition, the boron-containing anion is present in an amount of at least 0.5 and up to 10 weight %, and typically from about 1 to about 5 weight %, based on the total infrared radiation sensitive composition dry weight. The optimum amount of the various initiator composition components may differ for various compounds and the sensitivity of the infrared radiation-sensitive composition that is desired and would be readily apparent to one skilled in the art.

The onium cation and the boron-containing anion are present in the initiator and infrared radiation-sensitive composition (and imageable element described below) at a mole ratio of from about 0.5:1 to about 8:1 (typically from about 1.5:1 to about 6:1).

The metallocene is present at a mole ratio to the boron-containing anion of from about 0.25:1 to about 8:1 (typically from about 1:1 to about 5:1).

Some useful optional components are what are known as antioxidants that can be used to improve the resistance to curing in white light (fogging) of the radiation-sensitive composition in the imageable element. These compounds are believed to prevent oxidation of the polymeric binder(s) or infrared radiation absorbing dyes and include but not limited to, phosphorus-containing antioxidants, sulfur-based antioxidants, amine-containing antioxidants, and phenol-containing antioxidants. Examples of such antioxidants and useful amounts are described in [0051]-[0060] of U.S. Patent Application Publication 2003/0031951 (Aburano). Other phenol-containing antioxidants include, but are not limited to, hydroquinones (such as hydroquinone and benzoquinone), catechols (such as t-butyl catechol), naphthols, cresols (such as di-t-butyl-p-cresol), pyrogallol, 2,6-butyl-4-nonylphenol, p-methoxyphenol, 4,4'-thiobis(3-methyl-6-t-butylphenol), 2,2'-methylenebis-(4-methyl-6-t-butylphenol), N-nitrosophenylhydroxylamine cerous salt, and N-nitrosophenylhydroxylamine aluminum salt. Among the phenol-containing antioxidants, hindered phenolic compounds are useful including but not limited to, 2,6-di-t-butyl-4-methylphenol (Yoshinox BHT), tetrakis[methylene-3-(3,5'-di-t-butyl-4'-hydroxyphenol)propionate]methane (Tominox TT), Yoshinox SR, Yoshinox BB, Yoshinox 2246G, Yoshinox 425, Yochinox 250, Yoshinox 930, Tominox SS, Tominox 917, and GSY-314 (all available from Yoshitomi Fine Chemicals, Ltd., Japan) Other useful commercially available antioxidants are Irganox® 245 and Irganox® 1035 (Ciba Specialty Chemicals, Co.), the latter being thiodiethylene bi[3-(3,5-di-t-butyl-4-hydroxyphenyl)propionate] that is used in the Examples below. The antioxidant may be present in an amount of from about 0.1 to about 0.5 weight % based on the total dry weight of the radiation-sensitive composition or imageable layer described below.

Infrared Radiation-Sensitive Compositions

The initiator compositions and radiation-sensitive compositions may have any utility wherever there is a need for a coating that is polymerizable using suitable radiation, and particularly where it is desired to remove unexposed or non-irradiated regions of the composition. The radiation-sensitive compositions can be used to prepare an imageable layer in imageable elements such as printed circuit boards for integrated circuits, microoptical devices, color filters, photomasks, and printed forms such as lithographic printing plate precursors that are defined in more detail below, as well as in paint compositions, coating finishes, and molding compositions.

Besides the initiator composition described above, the infrared radiation-sensitive compositions include a free radically polymerizable component that contains one or more free radically polymerizable groups (that is, a carbon-carbon double bond) that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated compounds that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Still other useful free radically polymerizable components include hyperbranched polyester acrylate oligomers such as those commercially available as CN2300, CN2301, CN2302, CN2303, and CN2304 from Sartomer Company, Inc.

Numerous other free radically polymerizable compounds are known to those skilled in the art and are described in considerable literature including *Photoreactive Polymers: The Science and Technology of Resists*, A Reiser, Wiley, N.Y., 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, N.Y., 1989, pp. 226-262. For example, useful free radically polymerizable components are also described in EP 1,182,033A1 (noted above), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.).

In some embodiments, the free radically polymerizable component comprises carboxy groups in an amount sufficient to provide an acid number greater than 0 mg KOH per grams of polymerizable component, and generally from 0 and up to and including 200 mg KOH per gram of the polymerizable component. Free radically polymerizable compounds containing carboxy groups can be prepared in a number of ways. For example, oligomers containing carboxy groups can be prepared as described in the teaching of Col. 4 (line 42) to Col. 5 (line 19) and Col. 7 (line 14) to Col. 8 (line 45) of U.S. Pat. No. 4,228,232 (Rousseau). The carboxy groups can be added to the oligomers preferably after addition of the free radical polymerizable moieties by reaction of remaining hydroxy groups on the oligomer backbone with a compound having free carboxy groups (such as a dicarboxylic acid or anhydride). The resulting oligomers can be polymerized to provide a desired carboxy-substituted polymer.

Alternatively, a poly(urea urethane)acrylate or poly(urethane)-acrylate can be prepared from the reaction of a diisocyanate with a diol having free carboxy groups similarly to the preparation of allyl functional polyurethanes described in U.S. Pat. No. 5,919,600 (Huang et al.).

The free radically polymerizable component can be present in the infrared radiation-sensitive composition at a weight ratio to the primary polymeric binder (described below) of from about 5:95 to about 95:5, from about 10:90 to about 90:10, or from about 30:70 to about 70:30. For example, the free radically polymerizable component can be present in an amount of at least 10 and up to and including 70% (typically from about 20 to about 50%) based on the total solids in the radiation sensitive composition, or the total dry weight of the imageable layer.

The infrared radiation sensitive composition also includes an alkaline developer-soluble polymeric binder. These polymeric binders generally have a molecular weight of at least 2,000 and up to and including 1,000,000, at least 10,000 and up to and including 200,000, or at least 10,000 and up to and including 100,000. The acid value (mg KOH/g) of the polymeric binder is generally from about 0 and up to and including 400, at least 0 and up to and including 200, as determined using known methods.

The polymeric binder(s) can comprise at least 10 and up to 80 weight % (typically from about 15 to about 40 weight %), based on the total dry weight of the radiation-sensitive composition (or imageable layer). The polymeric binders may be homogenous, that is, dissolved in the coating solvent, or they may exist as discrete particles.

Useful polymeric binders include but are not limited to, (meth)acrylic acid and acid ester resins [such as (meth)acrylates], polyvinyl acetals, phenolic resins, polymers derived from one or more (meth)acrylates, (meth)acrylonitriles, styrene, N-substituted cyclic imides or maleic anhydrides, including those described in EP 1,182,033 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.). Also useful are the vinyl carbazole polymers described in copending and commonly assigned U.S. Ser. No. 11/356,518 (filed Feb. 17, 2006 by Tao et al.), and the polymers having pendant vinyl groups as described in copending and commonly assigned U.S. Ser. No. 11/349,376 (filed Feb. 7, 2006 by Tao et al.). Copolymers of polyethylene glycol methacrylate/acrylonitrile/styrene in particulate form, dissolved copolymers of carboxyphenyl methacrylamide/acrylonitrile/methacrylamide/N-phenyl maleimide, copolymers of polyethylene glycol methacrylate/acrylonitrile/vinylcarbazole/styrene/methylacrylic acid, N-phenyl maleimide/methacrylamide/methacrylic acid, urethane-acrylic intermediate A (the reaction product of p-toluene sulfonyl isocyanate and hydroxyl ethyl methacrylate)/acrylonitrile/N-phenyl maleimide, and N-methoxymethyl methacrylamide/methacrylic acid/acrylonitrile/n-phenylmaleimide are also useful.

Other useful polymeric binders in the infrared radiation-sensitive composition (and imageable elements described below) are those having poly(alkylene glycol) side chains directly or indirectly linked to the polymeric backbone. Many of such polymeric binders are dispersible, developable, or soluble in water or water/solvent mixtures. Such polymeric binders include polymeric emulsions, dispersions, or polymers having the pendant poly(alkylene glycol) side chains. Such polymeric binders are described for example in U.S. Pat. Nos. 6,582,882 and 6,899,994 (both noted above) and U.S. Patent Application Publication 2005/0003285 (Hayashi et al.). In some instances, these polymeric binders are present in the imageable layer at least partially and possibly entirely, as discrete particles.

Other useful polymeric binders have hydrophobic backbones and comprise both of the following a) and b) recurring units, or the b) recurring units alone:

a) recurring units having pendant cyano groups attached directly to the hydrophobic backbone, and b) recurring units having pendant groups comprising poly(alkylene glycol) side chains.

These polymeric binders comprise poly(alkylene glycol) and cyano side chains. These polymers can be graft copolymers having a main chain polymer and poly(alkylene glycol) pendant side chains. Other polymers are block copolymers having blocks or segments of (alkylene glycol)-containing recurring units and non(alkylene glycol)-containing recurring units. Both graft and block copolymers can additionally have pendant cyano groups attached directly to the hydrophobic backbone. The alkylene glycol side chains generally comprise at least 10 constitutional alkylene glycol units and up to and including 150 of such units, at least 10 and up to and including 100 of such units, at least 10 and up to and including 50 of such alkylene glycol units, or at least 15 and up to and including 50 of such alkylene glycol units. The constitutional alkylene glycol units can be the same or different in an individual side chain and are generally $C_1$ to $C_6$ alkylene glycol groups, and more typically $C_1$ to $C_3$ alkylene glycol groups. The alkylene portions can be linear or branched or substituted versions thereof. For example, poly(ethylene glycol) and poly(propylene glycol) side chains are useful. Examples of such cyano-containing polymeric binders are described for example in U.S. Patent Application Publication 2005/003285 (noted above).

Other polymeric binders that are useful can be formed by polymerization of a combination or mixture of suitable ethylenically unsaturated polymerizable monomers or macromers, such as:

A) acrylonitrile, methacrylonitrile, or a combination thereof,

B) poly(alkylene glycol) esters of acrylic acid or methacrylic acid, such as poly(ethylene glycol) methyl ether acrylate, poly(ethylene glycol) methyl ester methacrylate, or a combination thereof, and C) optionally, monomers such as acrylic acid, methacrylic acid, styrene, hydroxystyrene, acrylate esters, vinyl carbazole, methacrylate esters, acrylamide, N-phenyl maleimide, carboxyphenyl methacrylamide, allyl methacrylate, carboxyphenyl maleimide, 2-acrylamido-2-methyl-1-propane sulfonic acid, methacrylamide, or a combination of such monomers.

The amount of the poly(alkylene glycol) side chains in such polymeric binders is at least 0.5 and up to and including 60 weight %, at least 2 and up to and including 50 weight %, or at least 5 and up to and including 20 weight %, based on the total polymeric binder weight. The amount of poly(alkylene glycol) segments in block copolymers is generally at least 5 and up to and including 60 weight %, or at least 10 and up to and including 30 weight %.

Where the polymeric binders comprise pendant cyano groups, the amount of such cyano groups is at least 5 and up to and including 99.5 weight %, at least 10 and up to and including 80 weight %, or at least 25 and up to and including 60 weight %, based on the total polymeric binder weight.

In some embodiments, it may be useful to include an acrylic-urethane hybrid polymer that is commercially available in dispersions from Air Products and Chemicals, Inc. (Allentown, Pa.) under the tradename Hybridur®, for example, the Hybridur® 540, 560, 570, 580, 870, and 878 acrylic-urethane hybrid dispersions.

The radiation-sensitive composition generally includes one or more infrared radiation absorbing chromophores, or sensitizers, that absorb imaging radiation, or sensitize the composition to imaging infrared radiation having a $\lambda_{max}$ of from about 700 nm and up to and including 1400 nm, and typically from about 700 to about 1200 nm. In some embodiments, the chromophore is cationic in nature.

Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squaraine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), and U.S. Pat. No. 6,787,281 (Tao et al.), and EP 1,182,033A2 (noted above).

A general description of one class of suitable cyanine dyes is shown by the formula in paragraph [0026] of WO 2004/101280 (Munnelly et al.), incorporated herein by reference, and useful IR absorbing compounds are identified below with the Examples.

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Other useful IR-sensitive dyes having the desired chromophore can be defined by the following Structure DYE-I:

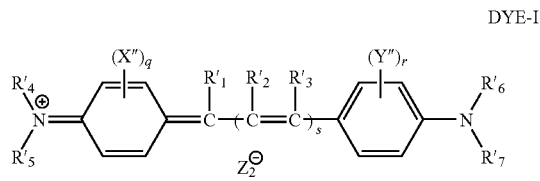

DYE-I wherein $R_1'$, $R_2'$, and $R_3'$ each independently represents hydrogen, or a halo, cyano, substituted or unsubstituted alkoxy (having 1 to 8 carbon atoms, both linear and branched alkoxy groups), substituted or unsubstituted aryloxy (having 6 to 10 carbon atoms in the carbocyclic ring), substituted or unsubstituted acyloxy (having 2 to 6 carbon atoms), carbamoyl, substituted or unsubstituted acyl, substituted or unsubstituted acylamido, substituted or unsubstituted alkylamino (having at least one carbon atom), substituted or unsubstituted carbocyclic aryl groups (having 6 to 10 carbon atoms in the aromatic ring, such as phenyl and naphthyl groups), substituted or unsubstituted alkyl groups (having 1 to 8 carbon atoms, both linear and branched isomers), substituted or unsubstituted arylamino, or substituted or unsubstituted heteroaryl (having at least 5 carbon and heteroatoms in the ring) group. Alternatively, any two of $R_1'$, $R_2'$, and $R_3'$ groups may be joined together or with an adjacent aromatic ring to complete a 5- to 7-membered substituted or unsubstituted carbocyclic or heterocyclic ring.

For example, $R_1'$, $R_2'$, and $R_3'$ are independently hydrogen, a substituted or unsubstituted carbocyclic aryl group, and a substituted or unsubstituted heteroaryl group.

$R_4'$, $R_5'$, $R_6'$, and $R_7'$ each independently represents hydrogen, a substituted or unsubstituted alkyl group (having 1 to 10 carbon atoms), a substituted or unsubstituted cycloalkyl group (having from 4 to 6 carbon atoms in the ring), a substituted or unsubstituted aryl group (having at least 6 carbon atoms in the ring), or a substituted or unsubstituted heteroaryl group (having 5 to 10 carbon and heteroatoms in the ring).

Alternatively, $R_4'$ and $R_5'$ or $R_6'$ and $R_7'$ can be joined together to form a substituted or unsubstituted 5- to 9-membered heterocyclic ring, or $R_4'$, $R_5'$, $R_6'$, or $R_7'$ can be joined to the carbon atom of the adjacent aromatic ring at a position ortho to the position of attachment of the anilino nitrogen to form, along with the nitrogen to which they are attached, a substituted or unsubstituted 5- or 6-membered heterocyclic ring.

For example, $R_4'$, $R_5'$, $R_6'$, and $R_7'$ are independently a substituted or unsubstituted alkyl group, a substituted or unsubstituted cycloalkyl group, a substituted or unsubstituted aryl group, or $R_4'$ and $R_5'$ or $R_6'$ and $R_7'$ can be joined together to form a substituted or unsubstituted 5- to 7-membered heterocyclic ring. Also, they can be independently substituted or unsubstituted alkyl groups of 1 to 8 carbon atoms, substituted or unsubstituted phenyl groups, or $R_4'$ and $R_5'$ or $R_6'$ and $R_7'$ can be joined together to form a substituted or unsubstituted 5- to 7-membered heteroaryl group.

In the DYE I structure, s is 1, 2, or 3, $Z_2$ is a monovalent anion, X" and Y" are each independently $R_1'$ or the atoms necessary to complete a substituted or unsubstituted 5- to 7-membered fused carbocyclic or heterocyclic ring, and q and r are independently integers from 1 to 4.

For example, X" and Y" are independently hydrogen or the carbon and heteroatoms needed to provide a fused aryl or heteroaryl ring.

Further details of such bis(aminoaryl)pentadiene IR dyes are provided, including representative IR dyes identified as DYE 1 through DYE 17, DYE 19, and DYE 20, in U.S. Pat. No. 6,623,908 (Zheng et al.).

Some useful infrared radiation absorbing dyes have a tetraaryl pentadiene chromophore. Such chromophore generally includes a pentadiene linking group having 5 carbon atoms in the chain, to which are attached two substituted or unsubstituted aryl groups at each end of the linking group. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain.

Such IR-sensitive dyes can be represented by the following Structure DYE-II:

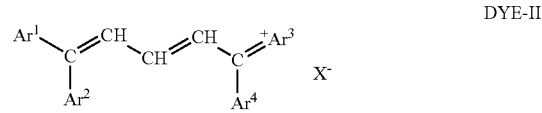

DYE-II wherein $Ar^1$ through $Ar^4$ are the same or different substituted or unsubstituted aryl groups having at least carbon atoms in the aromatic ring (such as phenyl, naphthyl, and anthryl, or other aromatic fused ring systems) wherein 1 to 3 of the aryl groups are substituted with the same or different tertiary amino group (such as in the 4-position of a phenyl group). Typically two of the aryl groups are substituted with the same or different tertiary amino group, and usually at different ends of the polymethine chain (that is, molecule). For example, $Ar^1$ or $Ar^2$ and $Ar^3$ or $Ar^4$ bear the tertiary amine groups. Representative amino groups include but are not limited to those substituted with substituted or unsubstituted alkyl groups having up to 10 carbon atoms or aryl groups such as dialkylamino groups (such as dimethylamino and diethylamino), diarylamino groups (such as diphenylamino), alkylarylamino groups (such as N-methylanilino), and heterocyclic groups such as pyrrolidino, morpholino, and piperidino groups. The tertiary amino group can form part of a fused ring such that one or more of $Ar^1$ through $Ar^4$ can represent a julolidine group.

Besides the noted tertiary groups noted above, the aryl groups can be substituted with one or more substituted or unsubstituted alkyl groups having 1 to 10 carbon atoms, halo atoms (such as chloro or bromo), hydroxyl groups, thioether groups, and substituted or unsubstituted alkoxy groups having 1 to 10 carbon atoms. Substituents that contribute electron density to the conjugated system are useful. While they are not specifically shown in Structure (DYE-II), substituents or fused rings may also exist on (or as part of) the conjugated chain connecting the aryl groups.

In Structure (DYE-II), $X^-$ is a suitable counterion that may be derived from a strong acid, and include such anions as $ClO_4^-$, $BF_4^-$, $CF_3SO_3^-$, $PF_6^-$, $AsF_6^-$, $SbF_6^-$, and perfluoroethylcyclohexylsulfonate. Other cations include boron-containing anions as described above (borates), methylbenzenesulfonic acid, benzenesulfonic acid, methanesulfonic acid, p-hydroxybenzenesulfonic acid, p-chlorobenzenesulfonic acid, and halides.

Two representative IR dyes defined by Structure (DYE-II) are defined as D1 and D2 in WO 98/07574 (Patel et al.). Still other useful IR-sensitive dyes are represented by the following Structure (DYE-III):

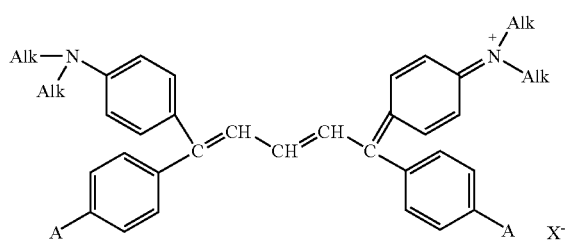

(DYE-III)

wherein "Alk" represents the same or different substituted or unsubstituted alkyl groups having 1 to 7 carbon atoms (such as substituted or unsubstituted methyl, ethyl, iso-propyl, t-butyl, n-hexyl, and benzyl), and "A" represents hydrogen or the same or different substituted or unsubstituted lower alkyl group having 1 to 3 carbon atoms (such as methyl, ethyl, n-propyl, and iso-propyl), or the same or different dialkylamino groups similar to those defined above for Structure (DYE-2), wherein such groups have the same or different alkyl groups. $X^-$ is a suitable counterion as defined above for Structure (DYE-II).

Some embodiments of this invention include a borate anion, such as a tetra-substituted borate anion, which substituents can be the same or different alkyl (having 1 to 20 carbon atoms) or aryl groups (phenyl or naphthyl groups), which groups can be further substituted if desired. Particularly useful boron-containing counterions of this type include alkyltriarylborates, dialkyldiarylborates, and tetraarylborates. Examples of these boron-containing counterions are described for example, in EP 438,123A2 (Murofushi et al.).

Representative useful dyes of this type are described as Dyes 2, 3-A, 3-B, 3-C, 12, and 22 described in EP 438,123A2 (noted above)

Useful infrared radiation absorbing dyes can be obtained from a number of commercial sources including Showa Denko (Japan) or they can be prepared using known starting materials and procedures.

The infrared radiation absorbing chromophore (or sensitizer) can be present in the radiation-sensitive composition in an amount generally of at least 0.5% and up to and including 15% and typically at least 1 and up to and including 10%, based on total solids in the composition, that also corresponds to the total dry weight of the imageable layer. The particular amount needed for this purpose would be readily apparent to one skilled in the art, depending upon the specific compound used to provide the desired chromophore.

The infrared radiation-sensitive composition can further comprise one or more phosphate (meth)acrylates, each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety.

Each phosphate moiety is typically connected to an acrylate moiety by an aliphatic chain [that is, an -(aliphatic-O)— chain] such as an alkyleneoxy chain [that is an -(alkylene-O)$_m$— chain] composed of at least one alkyleneoxy unit, in which the alkylene moiety has 2 to 6 carbon atoms and can be either linear or branchad and m is 1 to 10. For example, the alkyleneoxy chain can comprise ethyleneoxy units, and m is from 2 to 8 or m is from 3 to 6. The alkyleneoxy chains in a specific compound can be the same or different in length and have the same or different alkylene group.

Useful phosphate (meth)acrylates can be represented by the following Structure (I):

$$P(=O)(OM)_n(OR)_{3-n} \quad (I)$$

wherein n is 1 or 2, M is hydrogen or a monovalent cation (such as an alkali metal ion, ammonium cations including cations that include one to four hydrogen atoms). For example, useful M cations include but are not limited to sodium, potassium, —$NH_4$, —$NH(CH_2CH_2OH)_3$, and —$NH_3(CH_2CH_2OH)$. When n is 2, the M groups are the same or different.

The R groups are independently the same or different groups represented by the following Structure (II):

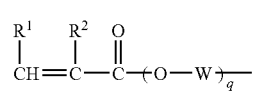

(II)

wherein $R^1$ and $R^2$ are independently hydrogen, or a halo (such as chloro or bromo) or substituted or unsubstituted alkyl group having 1 to 6 carbon atoms (such as methyl, chloromethyl, methoxymethyl, ethyl, isopropyl, and t-butyl groups).

In many embodiments, one or both of $R^1$ and $R^2$ are hydrogen or methyl, and in some embodiments, $R^1$ is hydrogen and $R^2$ is methyl).

W is an aliphatic group having at least 2 carbon or oxygen atoms, or combination of carbon and oxygen atoms, in the chain, and q is 1 to 10. Thus, W can include one or more alkylene groups having 1 to 8 carbon atoms that are interrupted with one or more oxygen atoms (oxy groups), carbonyl, oxycarbonyl, or carbonyl oxy groups. For example, one such aliphatic group is an alkylenecarbonyloxyalkylene group. Useful alkylene groups included in the aliphatic groups have 2 to 5 carbon atoms and can be branched or linear in form.

The R groups can also independently be the same or different groups represented by the following Structure (IIa):

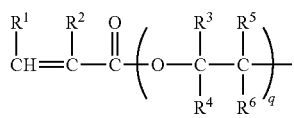

wherein $R^1$, $R^2$, and q are as defined above and $R^3$ through $R^6$ are independently hydrogen or a substituted or unsubstituted alkyl group having 1 to 6 carbon atoms (such as methyl, methoxymethyl), ethyl, chloromethyl, hydroxymethyl, ethyl, iso-propyl, n-butyl, t-butyl, and n-pentyl groups). Typically, $R^3$ through $R^6$ are independently hydrogen or methyl, and in most embodiments, all are hydrogen.

In Structures II and IIa, q is 1 to 10, or from 2 to 8, for example from 3 to 6.

Representative phosphate (meth)acrylates include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan) that is shown below, a phosphate of a di(caprolactone modified 2-hydroxyethyl methacrylate) that is available as Kayamer PM-21 (Nippon Kayaku, Japan) that is also shown below, and a polyethylene glycol methacrylate phosphate with 4-5 ethoxy groups that is available as Phosmer PE from Uni-Chemical Co., Ltd. (Japan) that is also shown below. Other useful nonionic phosphate acrylates are also shown below.

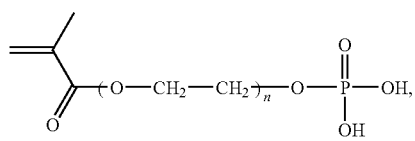

Phosmer PF (n = 4 or 5)

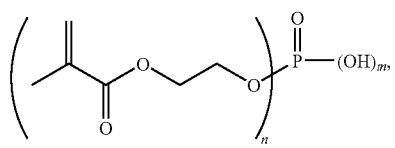

Kayamer PM-2 (m = 1 or 2, n = 3-m)

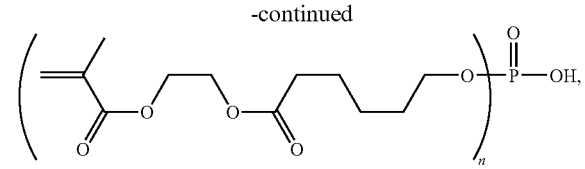

Kayamer PM-21 (n = 2)

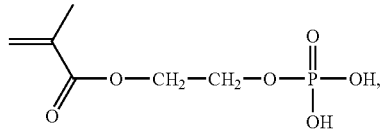

Phosmer M

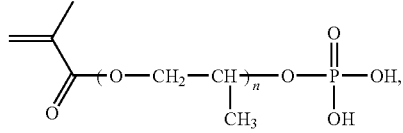

Phosmer PP (n = 5 or 6)

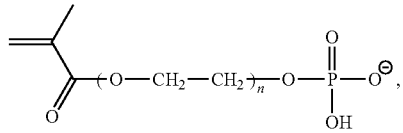

$HOCH_2CH_2NH_3^+$

Phosmer PEH (n is 4 or 5)

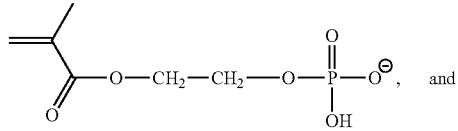 and $HOCH_2CH_2NH_3^+$

Phosmer MH

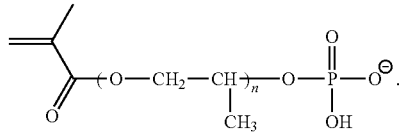

$HOCH_2CH_2NH_3^+$

Phosmer PPH (n is 5 or 6)

The phosphate (meth)acrylate can be present in the infrared radiation-sensitive composition in an amount of at least 0.5 and up to and including 20% and typically at least 0.9 and up to and including 10%, based on total dry composition weight.

The infrared radiation-sensitive composition can also include a "primary additive" that is a poly(alkylene glycol) or an ether or ester thereof that has a molecular weight of at least 200 and up to and including 4000, particularly when an overcoat is omitted from the imageable element. This primary additive is present in an amount of at least 2 and up to and including 50 weight %, based on the total solids content of the composition, or the total dry weight of the imageable layer. Particularly useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The infrared radiation-sensitive composition can also include a "secondary additive" that is a poly(vinyl alcohol), a poly(vinyl pyrrolidone), poly(vinyl imidazole), or polyester in an amount of up to and including 20 weight % based on the total solids content of the composition, or the total dry weight of the imageable layer.

The infrared radiation-sensitive composition may also include heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.).

The infrared radiation-sensitive composition can also include a variety of optional compounds including but not limited to, dispersing agents, humectants, biocides, plasticizers, surfactants for coatability or other properties, viscosity builders, pigments, dyes, or colorants to allow visualization of the written image (such as crystal violet, methyl violet, ethyl violet, Victoria blue, malachite green, and brilliant green), pH adjusters, drying agents, defoamers, preservatives, development aids, rheology modifiers or combinations thereof, antioxidants (described above), or any other addenda commonly used in the lithographic art, in conventional amounts. Useful viscosity builders include hydroxypropyl cellulose, hydroxyethyl cellulose, carboxymethyl cellulose, and poly(vinyl pyrrolidone).

Imageable Elements

The imageable elements can be formed by suitable application of an infrared radiation-sensitive composition as described above to a suitable hydrophilic substrate to form an imageable layer. This substrate can be treated or coated in various ways as described below prior to application of the infrared radiation-sensitive composition to improve hydrophilicity. Typically, there is a single imageable layer comprising the infrared radiation-sensitive composition. If the substrate has been treated to provide an "interlayer" for improved adhesion or hydrophilicity, the applied infrared radiation-sensitive composition is the "top" or outermost layer. These interlayers, however, are not considered "imageable layers".

The substrate generally has a hydrophilic surface, or at least a surface that is more hydrophilic than the applied infrared radiation-sensitive composition on the imaging side for lithographic uses. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of a hydrophilic aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of from about 1.5 to about 5 $g/m^2$ and more typically from about 3 to about 4.3 $g/m^2$. Phosphoric acid anodization generally provides an oxide weight on the surface of from about 1.5 to about 5 $g/m^2$ and more typically from about 1 to about 3 $g/m^2$. When sulfuric acid is used for anodization, higher oxide weight (at least 3 $g/m^2$) may provide longer press life.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly[(meth) acrylic acid], or acrylic acid copolymer to increase hydrophilicity. Still further, the aluminum support may be treated with a phosphate solution that may further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 600 μm.

The backside (non-imaging side) of the substrate may be coated with antistatic agents and/or slipping layers or a matte layer to improve handling and "feel" of the imageable element.

The substrate can also be a cylindrical surface having the infrared radiation-sensitive composition applied thereon, and thus be an integral part of the printing press. The use of such imaging cylinders is described for example in U.S. Pat. No. 5,713,287 (Gelbart).

The infrared radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the infrared radiation-sensitive composition is applied as the outermost layer.

Illustrative of such manufacturing methods is mixing the polymeric binder(s), radically polymerizable component, onium cation, boron-containing anion, infrared radiation absorbing chromophore, and any other components of the radiation-sensitive composition in a suitable organic solvent

[such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Examples below. After proper drying, the coating weight of the imageable layer is generally at least 0.1 and up to and including 5 g/m² or at least 0.5 and up to and including 3.5 g/m².

The imageable element does not include what is conventionally known as an overcoat (such as an oxygen impermeable topcoat) applied to the imageable layers.

Layers can also be present under the imageable layer to enhance developability or to act as a thermal insulating layer. The underlying layer should be soluble or at least dispersible in the developer and typically have a relatively low thermal conductivity coefficient.

The various layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps at conventional times and temperatures may also help in preventing the mixing of the various layers.

Some imageable elements can be used to provide a lithographic printing plate with a hydrophilic aluminum substrate, the imageable element having an imageable layer that includes an infrared radiation-sensitive dye having a tetraaryl pentadiene chromophore, a diaryliodonium cation, a titanocene, an alkyltriphenylborate anion, and a phenolic antioxidant, wherein the diaryliodonium cation and that alkyltriphenylborate anion are present at a mole ratio of from about 0.5:1 to about 8:1, and the titanocene is present at a mole ratio to the alkyltriphenyborate anion of from about 0.25:1 to about 8:1.

Once the various layers have been applied and dried on the substrate, the imageable element can be enclosed in water-impermeable material that substantially inhibits the transfer of moisture to and from the imageable element.

By "enclosed", we mean that the imageable element is wrapped, encased, enveloped, or contained in a manner such that both upper and lower surfaces and all edges are within the water-impermeable sheet material. Thus, none of the imageable element is exposed to the environment once it is enclosed.

Useful water-impermeable sheet materials include but are not limited to, plastic films, metal foils, and waterproof papers that are usually in sheet-form and sufficiently flexible to conform closely to the shape of the imageable element (or stack thereof as noted below) including an irregularities in the surfaces. Typically, the water-impermeable sheet material is in close contact with the imageable element (or stack thereof). In addition, it is preferred that this material is sufficiently tight or is sealed, or both, so as to provide a sufficient barrier to the movement or transfer of moisture to or from the imageable element. Useful water-impermeable materials include plastic films such as films composed of low density polyethylene, polypropylene, and poly(ethylene terephthalate), metallic foils such as foils of aluminum, and waterproof papers such as papers coated with polymeric resins or laminated with metal foils (such as paper backed aluminum foil). The plastic films and metallic foils are most preferred. In addition, the edges of the water-impermeable sheet materials can be folded over the edges of the imageable elements and sealed with suitable sealing means such as sealing tape and adhesives.

The transfer of moisture from and to the imageable element is "substantially inhibited", meaning that over a 24-hour period, the imageable element neither loses nor gains no more than 0.01 g of water per m². The imageable element (or stack) can be enclosed or wrapped while under vacuum to remove most of the air and moisture. In addition to or instead of vacuum, the environment (for example, humidity) of the imageable element can be controlled (for example to a relative humidity of less than 20%), and a desiccant can be associated with the imageable element (or stack).

For example, the imageable element can be enclosed with the water-impermeable sheet material as part of a stack of imageable elements, which stack contains at least 5 imageable elements and more generally at least 100 or at least 500 imageable elements that are enclosed together. It may be desirable to use "dummy", "reject", or non-photosensitive elements at the top and bottom of the stack improve the wrapping. Alternatively, the imageable element can be enclosed in the form of a coil that can be cut into individual elements at a later time. Generally, such a coil has at least 1000 m² of imageable surface, and commonly at least 3000 m² of imageable surface.

Adjacent imageable elements in the stacks or adjacent spirals of the coil may be separated by interleaving material, for example interleaving paper or tissue ("interleaf paper") that may be sized or coated with waxes or resin (such as polyethylene) or inorganic particles. Many useful interleaving materials are commercially available. They generally have a moisture content of less than 8% or typically less than 6%.

Imaging Conditions

During use, the imageable element is exposed to a suitable source of imaging or exposing infrared radiation, such as from an infrared radiation-emitting laser at a wavelength of at least 700 nm and up to and including about 1400 nm and typically at least 700 nm and up to and including 1200 nm. Imaging can be carried out using imaging radiation at multiple wavelengths at the same time if desired.

The laser used to expose the imageable element is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imageable layer.

While laser imaging is desired in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

Without a post-exposure baking step after imaging and before development, the imaged elements are generally developed "off-press". For example, they can be processed using conventional conditions and a conventional aqueous alkaline or organic solvent-containing developer. Alternatively, they can be developed off-press with water (such as warm water) and a little rubbing.

Typically, imaging (step A) is carried out using an infrared radiation-emitting laser and development (step B) is carried out off-press using an aqueous alkaline developer having a pH of 12 or less.

The developer composition commonly includes one or more ingredients selected from the group consisting of surfactants, chelating agents (such as salts of ethylenediaminetetraacetic acid), organic solvents (such as benzyl alcohol), and alkaline components (such as inorganic metasilicates, organic metasilicates, hydroxides, bicarbonates, organic amines, and sodium triphosphates). The pH of the alkaline developer is typically at least 8 and up to and including 14.

Developers commonly used for conventional negative-working elements may be used. Such developers are typically single-phase solutions containing organic solvents that are miscible or dispersible in water, surfactants, alkali agents, and other additives such as chelating agents, antifoamants, and algicides. The pH values of such developers are typically 12 or less and in the range of from about 7 to about 12. Useful organic solvents include the reaction products of phenol with ethylene oxide and propylene oxide [such as ethylene glycol phenyl ether (phenoxyethanol)], benzyl alcohol, esters of mono- di-, or triethylene glycol and of mono-, di-, or tripropylene glycol with acids having 6 or less carbon atoms, and ethers of mono-, di-, or triethylene glycol, diethylene glycol, and of mono-, di-, or tripropylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative developers used for conventional negative-working elements include ND-1 Developer, Developer 980, SP 200 Developer, "2-in-1" Developer, ProNeg D-501 Developer, 955 Developer, and 956 Developer (available from Eastman Kodak Company, Norwalk Conn.).

Developers commonly used for developing conventional positive-working elements may also be used. Such developers typically contain alkali agents (such as alkali metal silicate or metasilicates, alkali metal hydroxides, alkali metal triphosphates, and alkali metal carbonates), and optional additives such as surfactants, anticorrosion agents, chelating agents, antifoamants, and coating protection agents. Such developers generally have a pH of at least II and typically of at least 13. Useful developers of this type include 3000 Developer, 9000 Developer, GOLDSTAR Developer, GREENSTAR Developer, ThermalPro Developer, PROTHERM Developer, MX1813 Developer, TCD-300 Developer, and MX1710 Developer (all available from Eastman Kodak Company).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate.

Following off-press development, the imaged element can be rinsed with water and dried in a suitable fashion. The dried element can also be treated with a conventional gumming solution (such as gum arabic). In addition, a postbake operation can be carried out, with or without a blanket or floodwise exposure to UV or visible radiation. Alternatively, a blanket UV or visible radiation exposure can be carried out, without a postbake operation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The following examples are provided to illustrate the practice of the invention but are by no means intended to limit the invention in any manner.

EXAMPLES

The components and materials used in the examples and analytical methods used in evaluation were as follows:

AIBN represents azobisisobutyronitrile or 2,2'-azobis(2-methylpropionitrile), for example Vazo-64 that is available from DuPont (Wilmington, Del.).

Byk® 307 is a polyethoxylated dimethyl polysiloxane copolymer that was obtained from Byk Chemie (Wallingford, Conn.) in a 25 weight % xylene/methoxypropyl acetate solution.

Celvol 203s is an 88% hydrolyzed poly(vinyl alcohol) that is available from Celanese Corporation (Eddyville, Ky.).

CN2302 is a hyperbranched polyester acrylate oligomer that is available from Sartomer (Exton, Pa.).

IR Dye 1 is a cyanine dye that was obtained from Showa Denko (Japan) and has the following structure:

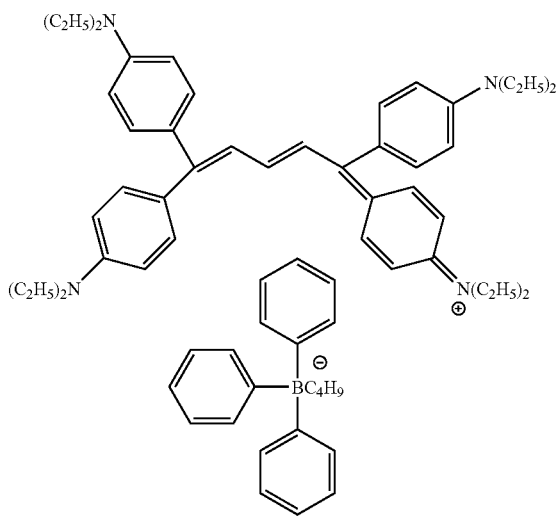

IR Dye 1

IR Dye 2 was obtained from Showa Denko (Japan) and has the following structure:

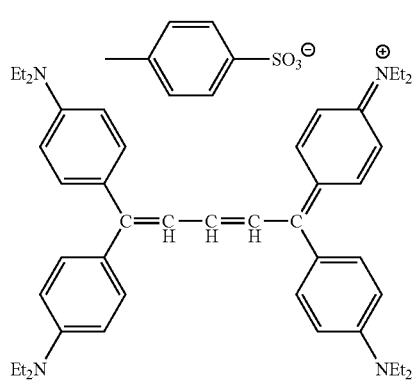

IR Dye 2

Irgacure® 250 is iodonium, (4,-methylphenyl)[4-(2-methylpropyl)phenyl]-, hexafluorophosphate that is available from Ciba Specialty Chemicals (Tarrytown, N.Y.), and is supplied as 75 wt. % in propylene carbonate.

Irgacure® 784 is bis(cyclopentadienyl)-bis(2,6-difluoro-3-(pry-1-yl)phenyl)titanium that was obtained from Ciba Speciality Chemicals (Tarrytown, N.Y.).

Irganox® 1035 is thiodiethylene bi[3-(3,5-di-tert-butyl-4-hydroxyphenyl)propionate] that was obtained from Ciba Specialty Chemicals.

Mercapto-3-triazole refers to mercapto-3-triazole-1H, 2, 4 that is available from PCAS (Paris, France).

Oligomer represents a urethane acrylate that was prepared by reacting two parts of hexamethylene diisocyanate with two parts of hydroxyethyl methacrylate and one part of 2-(2-hydroxyethyl)piperidine (30 wt. % in ethyl acetate).

Phosmer PE is an ethylene glycol methacrylate phosphate with 4-5 ethoxy groups that was obtained from Uni-Chemical Co. Ltd. (Japan).

PF represents an aluminum-containing substrate post-treatment with an inorganic monosodium phosphate solution activated by sodium fluoride.

Pigment A is a 23% solids dispersion of 7.7 parts of a polyvinyl acetal derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4) and 15.4 parts of Disperbyk® 167 dispersant (Byk Chemie) in 1-methoxy-2-propanol.

Polymer 1 was composed of recurring units derived from PEGMA, acrylonitrile, vinyl carbazole, styrene, and methacrylic acid at a weight ratio of 10/35/25/20/10 using conventional reaction conditions.

Polymer 2 was composed of recurring units derived from acrylonitrile, allyl methacrylate, and methacrylic acid at a weight ratio of 30/60/10 using conventional reaction conditions.

Polymer 3 was composed of recurring units derived from acrylonitrile, styrene, methacrylic acid, vinyl carbazole, and N,N-dimethylacrylamide at a weight ratio of 35/20/10/15/20 using conventional reaction conditions.

Triazine A is 2-(4-methoxyphenyl)-4,6-bis(trichloromethyl)-2-triazine that is available from PCAS (Paris, France).

955 Developer is an organic solvent-containing alkaline developer that is available from Eastman Kodak Company (Norwalk, Conn.).

Invention Examples 1-4 and Comparative Examples 1-4

Negative-working imageable elements were prepared by coating the imageable layer formulations described in TABLE I (parts by weight) below on electrochemically-grained and sulfuric acid anodized aluminum substrates that had been post-treated with PF. The imageable layer formulations were applied and dried to provide a dry coating weight of 1.5 g/m². The imageable layer formulations were applied using a wire-wound rod and then dried for approximately 60 seconds residence time in a Ranar conveyor oven set at 94° C.

TABLE I

| Component | Example 1 | Example 2 | Example 3 | Example 4 | Comparative Example 1 | Comparative Example 2 | Comparative Example 3 | Comparative Example 4 |
|---|---|---|---|---|---|---|---|---|
| Polymer 1 | 2.57 | 2.58 | 2.57 | 2.58 | 2.57 | 2.58 | 2.58 | 2.58 |
| CN2302 | 1.52 | 1.52 | 1.52 | 1.52 | 1.52 | 1.53 | 1.53 | 1.53 |
| Oligomer | 1.92 | 1.92 | 1.92 | 1.92 | 1.92 | 1.93 | 1.92 | 1.93 |
| Phosmer PE | 0.14 | 0.14 | 0.14 | 0.14 | 0.14 | 0.14 | 0.14 | 0.14 |
| Byk ® 307 | 0.04 | 0.04 | 0.04 | 0.04 | 0.04 | 0.04 | 0.04 | 0.04 |
| Pigment A | 1.35 | 1.35 | 1.35 | 1.35 | 1.35 | 1.35 | 1.35 | 1.35 |
| Irgacure ® 250 | 0.47 | 0.47 | 0.47 | 0.47 | 0.47 | 0.47 | 0.47 | 0.47 |
| IR Dye 1 | 0.14 | 0.14 | 0.14 | 0.14 | 0.14 | 0.14 | 0.14 | 0.14 |
| Irgacure ® 784 | 0.19 | 0.19 | 0.19 | 0.19 | — | — | — | — |
| Irganox ® 1035 | 0.04 | 0.04 | — | — | 0.04 | 0.04 | — | — |

TABLE I-continued

| Component | Example 1 | Example 2 | Example 3 | Example 4 | Comparative Example 1 | Comparative Example 2 | Comparative Example 3 | Comparative Example 4 |
|---|---|---|---|---|---|---|---|---|
| Mercapto-3-triazole | 0.21 | — | 0.21 | — | 0.21 | — | 0.21 | — |
| Water | 4.65 | 4.66 | 4.65 | 4.67 | 4.66 | 4.67 | 4.66 | 4.67 |
| γ-Butyrolactone | 4.53 | 4.54 | 4.53 | 4.54 | 4.55 | 4.55 | 4.54 | 4.55 |
| 2-Butanone | 60.04 | 60.17 | 60.06 | 60.19 | 60.15 | 60.28 | 60.18 | 60.31 |
| 1-Methoxy-2-propanol | 22.19 | 22.24 | 22.21 | 22.25 | 22.24 | 22.28 | 22.24 | 22.29 |

The resulting printing plates from the TABLE I imageable layer formulations were imaged on a Creo Trendsetter® 3244x at 3.5 W from 25 to 135 mJ/cm². The imaged elements were processed with 955 Developer. Solid image areas were then evaluated for the minimum exposure that produced 80% of the maximum post-process density ($E_{min}$).

Prior to the imaging step, the imageable elements were exposed to two sets of environmental conditions and compared to imageable elements that received no additional treatment following application of the imageable layer formulation. These tests were designed to artificially accelerate the shelf life stability of the imageable elements. For the 'dry' treatment, the imageable elements were separated by interleaving paper, wrapped in foil-lined paper, and placed in a 48° C. oven for five days. For the 'humid' treatment, the imageable elements were hung in a humidity chamber set at 40° C. and 80% relative humidity for five days. Following these two treatments, the imageable elements were allowed to equilibrate for 24 hours before the imaging and processing steps. TABLE II below shows the dry and humid test results ($E_{min}$ values in mJ/cm²) for Invention Examples 1-4 and Comparative Examples 1-4. The presence of the titanocene compound (Irgacure® 784) enabled the elements to pass the dry and humid accelerated aging tests.

TABLE II

| Example | $E_{min}$ | $E_{min}$ (dry) | $E_{min}$ (humid) | Test Result |
|---|---|---|---|---|
| Invention 1 | 41 | 79 | 54 | Pass |
| Invention 2 | 30 | 54 | 62 | Pass |
| Invention 3 | 30 | 51 | 56 | Pass |
| Invention 4 | 30 | 54 | 67 | Pass |
| Comparative 1 | 30 | 'ni' | 75 | Fail |
| Comparative 2 | 30 | 'ni' | 54 | Fail |
| Comparative 3 | 30 | 'pi' | 'pi' | Fail |
| Comparative 4 | 30 | 'ni' | 'ni' | Fail |

'ni' indicates that no images were present after the processing step
'pi' indicates that weak images with low optical density were present after processing step Failed printing plates provided poor or no images following processing or an $E_{min}$>150 mJ/cm².

Imageable elements from Invention Examples 1, 2, 3, and 4 were exposed to a white light environment (approximately 660 lux) for up to 24 hours. After the white light treatment period, they were processed with 955 Developer and the optical density of each element was evaluated for retained coating (or fogging). The optical densities were measured using an X-rite 418 densitometer with the cyan filter in place. Elements failed the white light test after the optical density of the treated area increased by 25% over the optical density of untreated area (time=0 hours). Typically, white light stability of at least two hours is required. Invention Example 3 failed the white light test after only 15 minutes while Invention Example 4 failed after one hour. Invention Examples 1 and 2 were stable in white light for at least 24 hours. The antioxidant compound, Irganox® 1035, is useful in order to extend the white light stability in the presence of the titanocene compound (Irgacure® 784).

The imageable elements from Invention Examples 1, 2, 3 and 4 were imaged at 80 mJ/cm², processed with 955 Developer, and treated with 850s Finisher (Eastman Kodak Company, Rochester, N.Y.). The resulting printing plates were then mounted on a Miehle sheet-fed press charged with black ink containing 1.5% calcium carbonate and fitted with a compressible blanket. The fountain solution was Varn 142 W etch at 3 oz per gallon (23.4 ml/liter) and PAR alcohol replacement at 3 oz per gallon (23.4 ml/liter). Invention Examples 1 and 3 ran 23,000 impressions before solid image wear was observed. Invention Examples 2 and 4 ran 30,000 impressions before solid image wear was observed. Omission of the mercaptotriazole compound, as in Invention Examples 2 and 4, improved the run length over Invention Examples 1 and 3 that both contained the mercaptotriazole compound. However, the presence of the antioxidant compound (Irganox® 1035) in Invention Example 2 extended the white light stability from one hour (Invention Example 4) to at least 24 hours (Invention Example 2).

Comparative Example 5

The Invention Example 2 described above was prepared and then an overcoat formulation was applied to the dried imageable layer. This overcoat formulation comprised 1.73 parts of Celvol 203s, 0.31 parts of a poly(vinyl imidazole), 0.1 parts of Byk® 348, 2.92 parts of isopropanol, and 94.03 parts of water and was applied and dried as described for the imageable layer to provide a dry overcoat coverage of 0.5 g/m². The resulting imageable element was imaged as described for Invention Example 2 at 3.5 W from 25 to 135 mJ/cm². This imaged element could not be developed using 955 Developer as was the imaged element in Invention Example 2. Thus, the presence of the overcoat was detrimental to development according to the present invention.

Invention Example 5

Invention Example 5 imageable elements were prepared as described in Invention Example 1 but using Polymer 2 in place of Polymer 1. The imageable elements were imaged and processed as in Invention Example 1. The resulting $E_{min}$ was ~30 mJ/cm².

Invention Example 6

Invention Example 6 imageable elements were prepared as described in Invention Example 1 but using Polymer 3 in place of Polymer 1. The imageable elements were imaged and processed as described in Invention Example 1. The $E_{min}$ was approximately 25 mJ/cm². Invention Example 6 imageable elements were exposed at 80 mJ/cm² and mounted on a printing press as described in Invention Example 1 and solid image wear was observed after 15,000 impressions.

Comparative Example 6

For Comparative Example 6, Invention Example 1 was repeated using Triazine A in place of Irgacure® 250. After imaging and processing as in Invention Example 1, image quality was poor and the En was estimated at 57 mJ/cm². After the dry accelerated aging test, no images were present after the processing step, and after the humid accelerated aging test, complete development with 955 Developer was not possible. Replacing Triazine A for Irgacure® 250 resulted in weak images and poor developability after the humid accelerated aging testing, and no images were present after the dry accelerated aging testing.

Comparative Example 7

For Comparative Example 7, Invention Example 2 was repeated except that Irgacure® 250 was omitted. The imageable elements were imaged and processed as described in Invention Example 2. During the development step, the developer and the water rinse used after development readily damaged the imaged regions. The $E_{min}$ was not determined due to the absence of solid imaged regions. The combination of a borate compound (IR Dye 1) and the metallocene compound (Irgacure® 784) was not effective to provide reaction initiation.

Comparative Example 8

For Comparative Example 8, Invention Example 2 was repeated except that Irgacure® 250 was omitted and IR Dye 1 was replaced with IR Dye 2. After imaging and processing as described in Invention Example 2, no imaged regions remained. When both the iodonium compound (Irgacure® 250) and the borate compound (IR Dye 1) were omitted, the metallocene compound (Irgacure® 784) was insufficient to initiate thermal photopolymerization.

Invention Example 7

The imageable layer composition described in TABLE III below was prepared and analyzed as in Invention Example 1. The $E_{min}$ determined for the dry test plate was 72 mJ/cm² and the $E_{min}$ determined for the humid test plate was 43 mJ/cm². The untreated plate had an $E_{min}$ of about 25 mJ/cm². When Irgacure® 784 was omitted from Invention Example 7 imageable layer formulation, the $E_{min}$ for fresh and humid test plates remained stable at about 25 mJ/cm² and about 50 mJ/cm², respectively. The $E_{min}$ for the dry test plate could not be determined as the imaged regions were removed during development. Thus, the image stability of the dry treated plate containing an alkyltriarylborate compound requires the presence of a titanocene compound.

TABLE III

| Component | Invention Example 7 (parts) |
| --- | --- |
| Polymer 1 | 2.47 |
| CN2302 | 1.46 |
| Oligomer | 1.83 |
| Phosmer PE | 0.14 |
| Byk ® 307 | 0.04 |
| Pigment A | 1.33 |

TABLE III-continued

| Component | Invention Example 7 (parts) |
| --- | --- |
| Tetra-n-butylammonium butyltriphenyl borate | 0.17 |
| IR Dye 2 | 0.14 |
| Irgacure ® 784 titanocene compound | 0.19 |
| Irganox ® 1035 | 0.04 |
| Mercapto-3-triazole | 0.20 |
| Irgacure ® 250 | 0.46 |
| Water | 4.54 |
| γ-Butyrolactone | 4.65 |
| 2-Butanone | 60.11 |
| 1-Methoxy-2-propanol | 22.23 |

Comparative Example 9

The imageable layer composition described in TABLE IV below was coated, imaged, and processed, and the $E_{min}$ was determined, as in Invention Example 1. For the dry test, the $E_{min}$ was about 33 mJ/cm². For the humid test, the $E_{min}$ was about 43 mJ/cm² and the $E_{min}$ for the untreated printing plate was about 44 mJ/cm². Comparative Example 9 printing plates were stable in white light for up to 2 hours before fogging was observed. When Irgacure® 784 was omitted from the Comparative Example 9 formulation, the $E_{min}$ for the dry test was about 50 mJ/cm², the $E_{min}$ for the humid test was about 44 mJ/cm², and the $E_{min}$ for the untreated printing plate was about 47 mJ/cm². Addition of the titanocene compound is not necessary as the formulation has stable imaging speed following the dry and humid tests. Thus, titanocene provides less benefit to the shelf-life stability of formulations containing a tetraarylborate compound.

TABLE IV

| Component | Comparative Example 8 (parts) |
| --- | --- |
| Polymer 1 | 2.47 |
| CN2302 | 1.46 |
| Oligomer | 1.82 |
| Phosmer PE | 0.14 |
| Byk ® 307 | 0.04 |
| Pigment A | 1.33 |
| bis-t-Butylphenyliodonium tetraphenylborate | 0.52 |
| IR Dye 2 | 0.14 |
| Irgacure ® 784 | 0.19 |
| Irganox ® 1035 | 0.04 |
| Mercapto-3-triazole | 0.21 |
| Water | 4.65 |
| γ-Butyrolactone | 4.65 |
| 2-Butanone | 60.11 |
| 1-Methoxy-2-propanol | 22.23 |

The invention has been described in detail with particular reference to certain preferred embodiments thereof, but it will be understood that variations and modifications can be effected within the spirit and scope of the invention.

The invention claimed is:

1. An infrared radiation-sensitive, free radical initiator composition consisting essentially of:
   a) an infrared radiation absorbing chromophore,
   b) an onium cation,
   c) a boron-containing anion,
   d) a metallocene, and
   f) optionally, an antioxidant, provided that when said onium cation and said boron-containing anion are provided as part of the same salt, the boron-containing anion is an alkyltriarylborate anion.

2. The composition of claim 1 wherein said infrared radiation absorbing chromophore is cationic and has a $\lambda_{max}$ of from about 700 to about 1200 nm.

3. The composition of claim 1 wherein said onium cation is an iodonium cation.

4. The composition of claim 3 wherein said iodonium cation is a diaryliodonium cation.

5. The composition of claim 1 wherein said metallocene is a titanocene.

6. The composition of claim 1 wherein said boron-containing anion is an alkyltriarylborate anion and is provided with said onium cation that is a diaryliodonium cation.

7. The composition of claim 1 wherein said onium cation and said boron-containing anion are present at a mole ratio of from about 0.5:1 to about 8:1, and said metallocene is present at a mole ratio to said boron-containing anion of from about 0.25:1 to about 8:1.

8. An infrared radiation-sensitive composition comprising:
   a) an infrared radiation absorbing chromophore,
   b) an onium cation,
   c) a boron-containing anion,
   d) a metallocene,
   e) optionally, an antioxidant,
   f) a radically polymerizable component, and
   g) an alkaline developer-soluble polymeric binder,
   provided that when said onium cation and said boron-containing anion are provided as part of the same salt, the boron-containing anion is an alkyltriarylborate anion.

9. The composition of claim 8 wherein said infrared radiation absorbing chromophore is cationic and has a $\lambda_{max}$ of from about 700 to about 1200 nm, and said onium cation is an iodonium salt.

10. The composition of claim 9 wherein said iodonium cation is a diaryliodonium cation, and said metallocene is a titanocene.

11. The composition of claim 8 wherein said boron-containing anion is an alkyltriarylborate anion and is provided with said onium cation that is a diaryliodonium cation.

12. The composition of claim 8 wherein said onium cation and said boron-containing anion are present at a mole ratio of from about 0.5:1 to about 8:1, and said metallocene is present at a mole ratio to said boron-containing anion of from about 0.25:1 to about 8:1.

13. The composition of claim 8 wherein said onium cation, boron-containing anion, and infrared radiation absorbing chromophore are provided from distinct sources.

14. A negative-working, infrared radiation-sensitive imageable element comprising a substrate having thereon a single imageable layer as the outermost layer, said imageable layer comprising:
   a) an infrared radiation absorbing chromophore,
   b) an onium cation,
   c) a boron-containing anion,
   d) a metallocene,
   e) optionally, an antioxidant,
   f) a radically polymerizable component, and
   g) an alkaline developer-soluble polymeric binder,
   provided that when said onium cation and said boron-containing anion are provided as part of the same salt, the boron-containing anion is an alkyltriarylborate anion.

15. The element of claim 14 wherein said infrared radiation absorbing chromophore is cationic and has a $\lambda_{max}$ of from about 700 to about 1200 nm, said onium cation is an iodonium cation, and said metallocene is a titanocene.

16. The composition of claim 14 wherein said boron-containing anion is an alkyltriarylborate anion and is provided with said onium cation that is a diaryliodonium cation.

17. The element of claim 14 wherein said iodonium cation and said boron-containing anion are present at a mole ratio of from about 0.5:1 to about 8:1, and said metallocene is present at a mole ratio to said boron-containing anion of from about 0.25:1 to about 8:1.

18. The element of claim 14 wherein said substrate is an aluminum-containing substrate having a hydrophilic surface upon which said imageable layer is disposed.

19. The element of claim 14 wherein said antioxidant is a hindered phenolic compound.

20. The element of claim 14 wherein said boron-containing anion is provided as part of said infrared radiation absorbing chromophore.

21. A method of making an imaged element comprising:
   A) imagewise exposing the imageable element of claim 13 using imaging infrared radiation to produce exposed and non-exposed regions, and
   B) without a post-exposure baking step, developing said imagewise exposed element off-press to remove only said non-exposed regions.

22. The method of claim 21 wherein step A is carried out using an infrared radiation-emitting laser and step B is carried out off-press using an aqueous alkaline developer having a pH of 12 or less.

23. The method of claim 21 that provides a lithographic printing plate with a hydrophilic aluminum substrate,
   said imageable element having an imageable layer that includes an infrared radiation-sensitive dye having a tetraaryl pentadiene chromophore, a diaryliodonium cation, a titanocene, an alkyltriphenylborate anion, and a phenolic antioxidant,
   wherein said diaryliodonium cation and said alkyltriphenylborate anion are present at a mole ratio of from about 0.5:1 to about 8:1, and said titanocene is present at a mole ratio to said alkyltriphenyborate anion of from about 0.25:1 to about 8:1.

* * * * *